United States Patent [19]

Koenig et al.

[11] 3,962,690

[45] June 8, 1976

[54] THIN FILM MAGNETIC STORAGE DEVICE

[75] Inventors: Roland Koenig, Ludwigshafen; Hermann Deichelmann, Schwetzingen; Herbert Henkler, Ludwigshafen, all of Germany

[73] Assignee: BASF Aktiengesellschaft, Ludwigshafen (Rhine), Germany

[22] Filed: Sept. 5, 1974

[21] Appl. No.: 503,285

[30] Foreign Application Priority Data

Sept. 6, 1973 Germany............................ 2344983

[52] U.S. Cl...................... 340/174 ZB; 340/174 M; 340/174 SR; 340/174 TF
[51] Int. Cl.²......................................... G11C 19/08
[58] Field of Search............... 340/174 MC, 174 FB, 340/174 TF, 174 ZB, 174 SR, 174 M

[56] References Cited
UNITED STATES PATENTS

| | | | |
|---|---|---|---|
| 3,068,453 | 12/1962 | Broadbent................... | 340/174 MC |
| 3,241,126 | 3/1966 | Snyder........................ | 340/174 MC |
| 3,292,161 | 12/1966 | Broadbent................... | 340/174 MC |
| 3,739,358 | 6/1973 | Battarel...................... | 340/174 MC |

Primary Examiner—James W. Moffitt
Attorney, Agent, or Firm—Johnston, Keil, Thompson & Shurtleff

[57] ABSTRACT

A thin film magnetic storage device consisting of a flat support to which a ferromagnetic layer which areas of different coercive force is applied, the low coercive force areas being surrounded by high coercive force areas, and further consisting of electric conductors extending in planes parallel with the support and used to produce the magnetic fields required for the propagation of magnetic domains in the low coercive force areas. The low coercive force areas are provided in the shape of strip-like channels, and the electric conductors are arranged in two separate planes such that they intersect the channels at right angles and that the conductors of one plane, at points of intersection with the channels are situated above the gaps between the conductors of the second plane, and that the width of the conductors at points of intersection with the channels is at least as great as the channel width. Thin film magnetic storage devices having this structure are simpler and cheaper to manufacture and are characterized by higher noise immunity and a low power requirement.

2 Claims, 7 Drawing Figures

THIN FILM MAGNETIC STORAGE DEVICE

This invention concerns a thin film magnetic storage device of simplified construction and improved operation, which consists of a. a flat support to which a ferromagnetic layer is applied which contains areas of different coercive force, the low coercive force areas being surrounded by higher coercive force areas, and of b. electric conductors extending in planes arranged parallel with the support which serve for producing the magnetic fields required for the propagation of magnetic domains in the low coercive force areas.

This film magnetic storage devices with shifting magnetic domains are already known. Magnetic domains are areas of spontaneous magnetization. if such thin layers consist of a ferromagnetic material with single-axis anisotropy, the binary values 1 and 0 can be allocated to the two preferred states of magnetization.

As in the case of known processes of magnetization reversal, a small external field can be used to transfer the direction of magnetization of one area to another. However, the strength of the external magnetic field must be such that, together with the component of one area, it can reverse the magnetization of the next area, although unable by itself to affect area orientation. In order to let this operation proceed in a controlled manner, the thin film magnetic storage device must have preferred directions of propagation. To achieve this object, zones — which, in the following description, will be referred to as channels — of comparatively low coercive force are provided in surroundings of higher coercive force. The high-coercive force areas are pre-magnetized to the point of saturation and prevent the formation of domains at the channel edges. Those areas within the channels whose magnetization is anti-parallel to the magnetization outside the channels will be defined as binary 1 areas. When using electric conductors taken across the channels, a periodic programme of current pulses enables corresponding magnetic fields to be produced which will shift domains as information carriers from one storage location to the next, as in a shift register. In particular, what is required are the steps of writing, shifting and verifying the domains, and this is accomplished by a suitable sequence of field pulses, generated by a correspondingly arranged system of conductors. Alternatively, the process of verification can also be accomplished by means of the Hall or the Kerr effect.

The physical principles of thin film magnetic storage devices with domain propagation are known (R. J. Spain, Journal of Applied Physics, Vol. 37, No. 7, June 1966, pp. 2572 ff.).

It is also known that the ferromagnetic layers for these storage devices must have a very low coercive force ($H_c$) in the channels, at least three times as large an anisotropic coercive force ($H_K$), and an even greater coercive force ($H_{ca}$) outside the channels. It is likewise known that the stipulated properties can be achieved, in particular, with Ni/Fe/Co alloys, if an aluminum layer is applied outside the channels between the support and the magnetic layer (R. J. Spain, Journal of Applied Physics, Vol. 37, No. 7, June 1966, pp. 2584 ff.). The same paper discloses an embodiment of a thin film magnetic storage device. This storage device is characterized by a linear storage density of 16 bits/inch (= 6 bits/cm) and four planes in which four conductors extend. The disadvantages of this embodiment, apart from the low storage density, must be seen in the extremely costly production of the electric conductors.

This film magnetic storage devices are known in which narrow channels are applied to the support in zig-zag shape (U.S. Pat. 3,438,016). Shifting of the domains within the channels can here be effected in the direction of the easy axis as well as in a direction perpendicular to that axis. On completion of, a shift cycle, the domains are situated in storage locations defined by the corners of the zig-zag pattern. The speed with which the domains can be shifted is limited and predetermined by the properties of the ferromagnetic layer. A disadvantage of this embodiment, therefore, is the long propagation paths having to be traversed by the domains between adjacent storage locations which restrict the attainable clock frequencies. Another disadvantage of this embodiment is the complex pulse programme required for a shift cycle. A rather grave disadvantage is the fact that two periodic magnetic fields extending over the entire support have to be generated in order to shift the domains. Quite apart from their high power consumption, the electric conductors required for generating such "non-localized" magnetic fields exhibit a high self induction which makes it impossible to attain clock frequencies in the MHz region.

Other thin film magnetic storage devices have become known which operate with a lower number of electric conductors and in which, moreover, the magnetic fields required for producing, shifting and erasing magnetic domains have to be produced only in the direction of the easy axis, the propagation paths of the domains between adjacent storage locations being comparatively short (U.S. Pat. Nos. 3,562,722 and 3,656,126). This object has been attained by using a special channel structure which, for magnetic fields of a certain strength, permits of only one direction of domain propagation in the channel (U.S. Pat. No. 3,465,316). In this case, the disadvantage, apart from a rather complex channel pattern of low noise immunity, is mainly the fact that the magnetic field used for domain propagation can only be varied within narrow limits. Also, this magnetic field is "non-localized" and suffers from the above-mentioned disadvantage of a limited clock frequency.

The present invention has for its object a thin-film magnetic storage device improved by suitable measures such that its design and producing is simplified, its noise immunity improved and its power requirement lowered.

Another object of the invention is to reduce the number of planes needed for the electric conductors, and thus to simplify the pulse programme for domain propagation, and so to device the arrangement of the conductors that "non-localized" magnetic fields are avoided.

Another object of the invention is, by suitable arrangement of the channels, to keep the propagation paths of the domains between adjacent storage locations as short density and to reduce the time to increase the linear storage density and to reduce the time required per shift cycle.

It was found that the above-mentioned requirements are largely fulfilled by thin film magnetic storage devices consisting of a. a flat support to which a ferromagnetic layer is applied which contains areas of different coercive force and in which the low coercive force areas are surrounded by higher coercive force areas, and of b. electric conductors extending in planes parallel with the support, for generating the magnetic fields required for the propagation of magnetic domains in the low coercive force areas, if the low coercive force areas are of strip-like shape and the electric conductors.

A. are arranged in two separate layers such that they intersect the channels at right angles and the conductors of one plane, at the points of intersection with the channels, are situated above the gaps between the conductors of the second plane, and B. the width of the conductor at the points of intersection with the channels is at least as great as the channel width.

The electric conductors for the two separate layer according to the invention are preferably applied to a flat support in conventional manner and then arranged relative to the support of the ferromagnetic layer as indicated by the invention.

In another advantageous embodiment of the invention, electric conductors separated by thin insulating layers are applied directly to a suitably devised ferromagnetic layer, their arrangement relative to the chanels being indicated by the invention.

The invention will now be explained in further detail with reference to the accompanying drawings in which an embodiment thereof is illustrated:

Figure 1A:
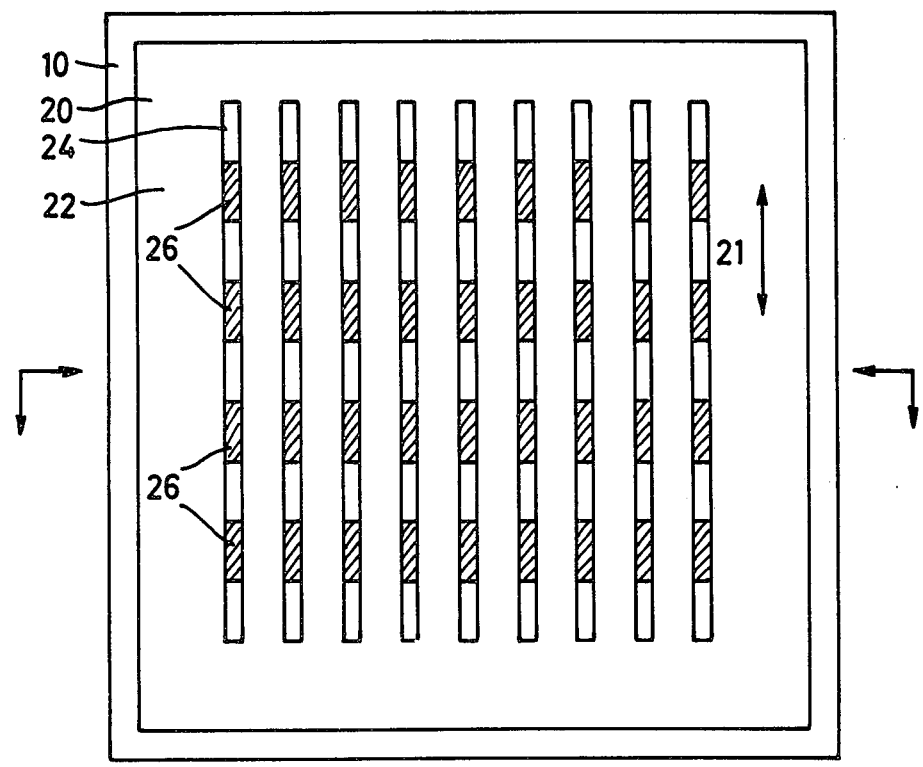
FIG. 1 shows the structure of a storage layer according to the invention in diagrammatic representation:
 a. in plan
 b. in section

FIG. 1 indicates diagrammatically the structure of a storage layer according to the invention. The layer is applied to a support 10. This may consist of glass, ceramic material, metal, synthetic material or some other non-magnetic substance of low surface roughness. Preferably, fire-polished glass plates are used. A ferromagnetic layer 20, between 10 and 500 nm thick, is applied to this support. The easy axis, i.e. the two stable positions of magnetization, are indicated in FIG. 1a by the double arrow 21. These ferromagnetic layers may consist of iron, cobalt or nickel, or of alloys of two or more of these elements which may contain additions of phosphorus, copper, gold, aluminum, silver or of a metal from the group of rare earths. In the embodiment of the invention, preferably a Ni:Fe:Co alloy of the composition 64:15:21, which is free from magnetostriction and has a thickness of 100 nm, is used. These layers have a coercive force $H_c$ of 4 Oe and an anisotropic field strength $H_K$ of 28 Oe. The ferromagnetic layer 20 must contain areas of different coercive force. This is achieved in that the coercive force $H_{ca}$ in the regions outside the channels is increased relative to the coercive strength $H_c$ within the channels. One method for achieving this is the selective application of another ferromagnetic layer of higher coercive force in the areas outside the channels. Such layers consist preferably of Ni, Co or Co/P, and have a coercive force of 20 to 1000 Oe. Strong exchange coupling prevails between the suprajacent layers which prevents independent changes of magnetization in one layer only. In this way, the low coercive force in the covered areas is increased, whereas the coercive force in the non-covered areas is not.

Figure 1B:
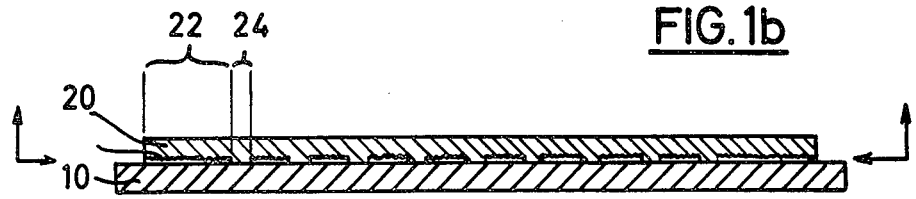

A modification of this method consists is covering the channels with an intermediate layer consisting of SiO, synthetic resin or photo-resist and then applying a uniform magnetic layer of higher coercive force. The above-mentioned coupling takes place in the areas outside the channels, whereas such as a coupling effect is avoided within the channels by the intermediate layer. Another method for obtaining differential coercive forces consists in applying a thin Cu or Au layer in the areas outside the channels. Following a subsequent temperature increase, the Cu or Au is diffused into the ferromagnetic layer, the result being an increase of the coercive force outside of the channel, whereas the coercive force within the channel remains unaffected. The preferred method used in the embodiment of the invention for obtaining different coercive forces is illustrated in FIG. 1b. In the areas 22, outside the channels, a 10 to 20 nm aluminum layer is evaporated at an elevated temperature between the ferromagnetic layer 20 and the support 10. Owing to its insignificant thickness, it is not a continuous layer, but consists of a multitude of microscopically small islands. In the channel areas, this aluminum layer is removed by using a known photoetching technique. The above-mentioned ferromagnetic layer 20 is vapordeposited by means of an electron beam gun. In the areas outside the channels the coerciver force of the magnetic layer is then increased from 4 Oe to 70 Oe, owing to the microscopic roughness of the intermediate aluminum layer. Instead of aluminum, it is also possible to use silver.

The channels serving for the storage and the shifting of data can be of different and sometimes very complex formation. According to the invention, simple strip-like channels are preferred which run parallel with the easy axis, as indicated in FIG. 1a by the reference numeral 24. This channel structure is of simple design, characterized by high noise immunity and is easy to manufacture by the above-described method for producing a magnetic layer. Within the channels, binary information in the shape of elongated domains can be stored. The storage locations are indicated by the reference numeral 26. The channel width is between $10/\mu m$ and $50/\mu m$. For reasons of stability, the length of the domains should be at least twice the width, and they must be spaced apart from one another by at least one domain length. The channel structure proposed by the invention enables the feasible storage density to be fully exploited and reduces the paths of domain propagation between adjacent storage locations to a minimum.

Figure 2A:
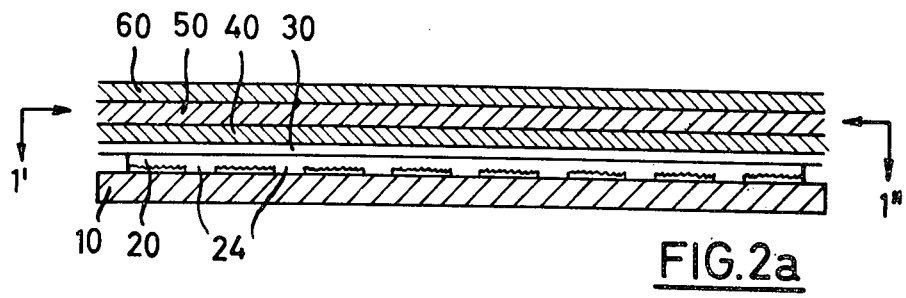
FIGS. 2a and 2c:
 show the arrangement of the electric conductors in partisectional views.

The magnetic fields required for shifting the magnetic domains are generated by current pulses in the electric conductors. The position of these conductors in two separate planes is shown in FIG. 2a in a part-sectional view, in relation to the support 10 and the ferromagnetic layer 20 applied thereto.

Above the magnetic layer 20 is provided an electrically insulating layer 30, consisting for example of evaporated SiO, coated synthetic resin or of a synthetic film placed thereon. Above the layer 30, a first group of electro conductors is provided in the plane 40. These conductors are preferably obtained in a photo-etching process from a uniform Cu layer of 101 μm to 30/μm thickness. A second group of conductors extends in the plane 60, and the conductors of the planes 60 and 40 are separated by a further insulating layer 50. The conductors of the two separate planes 40 and 60 are preferably produced in the form of a thin, bilaterally Cu-coated polyester film which is brought into contact with the insulating layer 30 after photo-etching on both sides has been completed.

Figure 2B:
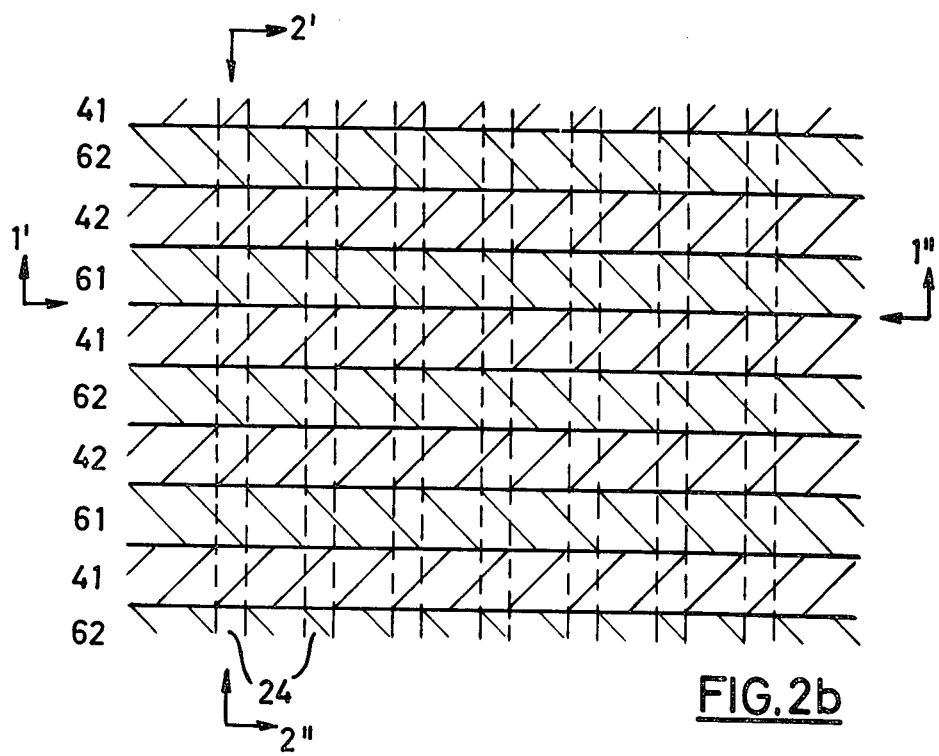
FIG. 2b shows the shape of the electric conductors over a partial area.
Figure 2C:
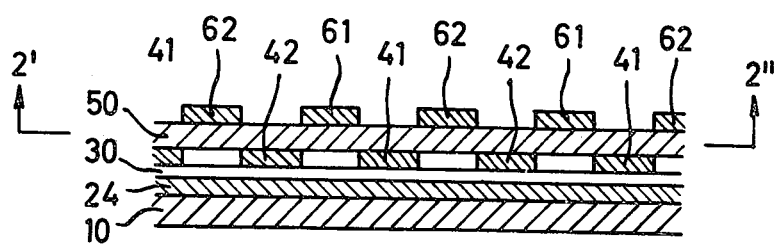

The shape of the electric conductors in the two planes 40 and 60 is shown in FIG. 2b. The conductors 41 and 42, which intersect the channels 24 perpendicularly, extend in plane 40. The conductors 61 and 62 which, at points of intersection with the channels are situated above the gaps between the conductors 41 and 42 of plane 40, extend in the plane 60. FIG. 2c shows a partial section along one channel. In the embodiment shows a partial section along one channel. In the embodiment illustrated here, the conductors of both planes are of identical width, and the gaps between the conductors of one plane have the same width as the conductors themselves. However, the conductors of plane 40 may also be wider than the conductors of plane 60, and the gaps between the conductors within one plane may be narrower than the conductors themselves. Moreover, partial overlapping of the conductors of the two separate planes 40 and 60 is feasible, but then the conductors of plane 60 must be situated symmetrically above the gaps between the conductors of plane 40. The advantages of electric conductors according to the invention is their simple, straight configuration and the fact that they can be manufactured easily in the shape of a bilaterally etched circuit. The insulating layers 30 and 50 may be kept very thin, keeping the energy requirement for domain propagation low.

Figure 3A:
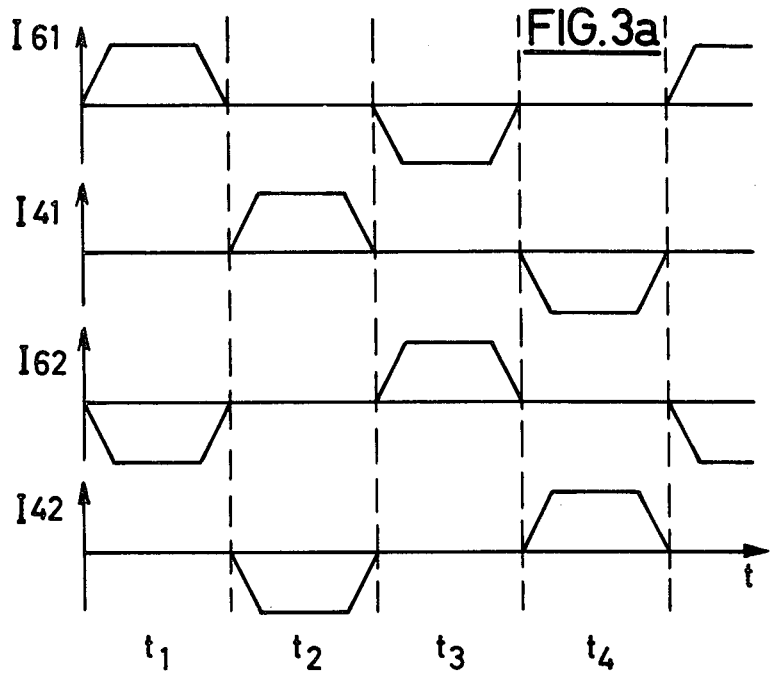
FIG. 3a shows the sequence of pulses to be applied to the electric conductions.
Figure 3B:
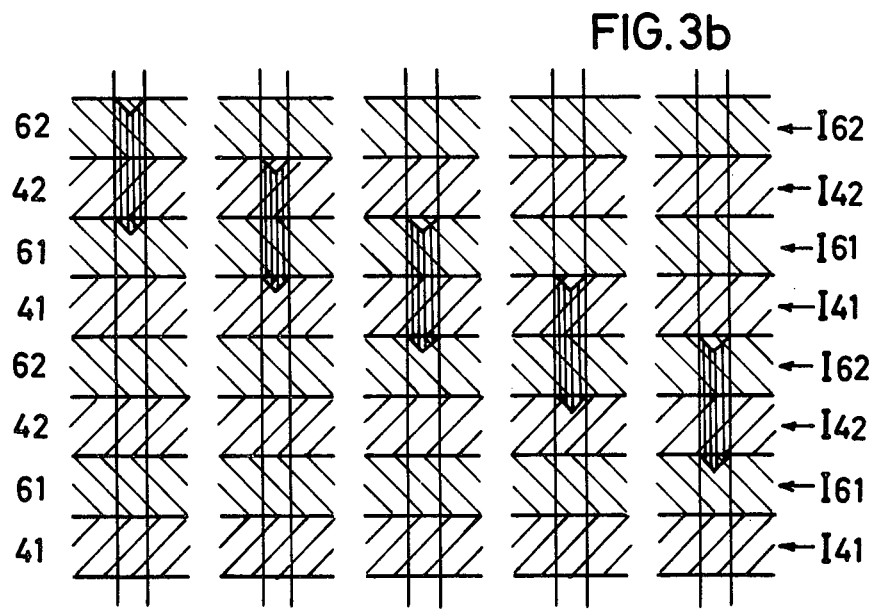
FIG. 3b shows the movement of a domain during a cycle.

The mechanism of domain propagation according to the invention will now be explained with reference to the pulse sequence illustrated in FIG. 3a. The cycle for shifting a domain to an adjacent storage location has been subdivided into four individual steps, t1 to t4. FIG. 3b indicates the position of the domain upon completion of every individual step. Let us assume that a domain, defined by the point of intersection between the channel and the conductors 62 and 42, be present at zero time. During t1 a current passes along conductors 61 in the direction of the arrow, which current shall be referred to as a positive current. This generates in the magnetic layer a localized magnetic field, parallel with the easy axis 21. This magnetic field, the strength of which must exceed the coercive force $H_c$ in the channels, causes the domain present in the area below the conductor 61 to grow. At the same time, the conductors 62 receive a negative pulse, i.e. a current opposing the arrow. This causes the domain below the conductor 62 to shrink. At the instant 1, the domain is situated at the point of intersection between the channel and the conductors 42 and 61. During t2, the conductor 41 receive a positive pulse and the conductor 42 a negative pulse, which causes the domain in the area below 41 to grow and that in the area below 42 to shrink. On completion of a full cycle, i.e. after t4, the domain will have been shifted to the adjacent storage location below conductors 62 and 42, and the next cycle will start. If the pulse durations t1 to t4 are short, the domains move through the channel at nearly uniform speed. The shortest possible cycle time can be derived from the finite mobility of the domains, i.e. $10^4$ cm/s × Oe. The arrangement of the invention, therefore, enables the high mobility of the domains to be fully exploited. In order to prevent the additional generation of new domains, the magnetic fields produced for the purpose of propagation must be smaller than the anisotropic field strength $H_K$. Deviating from the pattern illustrated in FIG. 3a, consecutive current pulses could also partially overlap. Within certain limits, this will not create critical excess fields, because only localized fields are being generated by the electric conductors. On the contrary, such overlapping is bound to increase the uniformity of movement and thus the propagation speed of the domains.

FIG. 3b shows that the domain length equals twice the conductor width. The above-described conditions for the stability of magnetic domains will therefore obtain if the conductor width is at least as great as the channel width. With the described propagation mechanism it is possible to avoid "non-localized" magnetic fields completely while using a simple pulse sequence. This makes the use of clock frequencies in the MHz range possible.

At the beginning of the channels, domains can be generated in known manner by means of additional electric conductors which produce localized magnetic fields greater than the anisotropic field $H_K$. At the channel end, the presence of domains can be verified by further conductors, either inductively or by resistance measurement. If non-destructive readout is desired, the data obtained at the channel end are preferably amplified and re-entered electronically at the starting point of the channel. Such additional conductors are preferably accommodated within planes 40 to 60.

The invention provides a thin film magnetic storage device with only two different planes for the electric conductors. This constitutes a considerable simplification of the design, manufacture and operation of a storage device which, at the same time, offers the advantage of enhanced reliability.

We claim:

1. An improved thin film magnetic storage device of the type having a flat support to which a ferromagnetic layer is applied, said layer containing areas of low coercive force which are in the shape of strip-like channels and which are surrounded by areas of higher coercive force, and wherein electric conductors extend in planes parallel with said flat support which are adapted for the flow of electrical signal current which establishes the magnetic fields needed to nucleate, propagate, read and erase the magnetic domains in the low coercive force areas, the improvement comprising:

said electric conductors being arranged in two separate planes in a manner such that they intersect said channels perpendicularly, the conductors of one plane at the point of intersection with said channels being situated about the gaps between the conductors of the second plane.

2. The improved thin film magnetic storage device of claim 1 wherein the two separate planes in which said electric conductors are arranged are situated on either side of a flexible, electrically insulating support.

* * * * *